(12) United States Patent
Taga et al.

(10) Patent No.: US 9,390,948 B2
(45) Date of Patent: Jul. 12, 2016

(54) TAPE ATTACHING APPARATUS AND TAPE ATTACHING METHOD

(71) Applicant: NEC Engineering, Ltd., Tokyo (JP)

(72) Inventors: Yoichiro Taga, Tokyo (JP); Eiichiro Aoki, Tokyo (JP)

(73) Assignee: NEC ENGINEERING, LTD., Tokyo (JP)

( * ) Notice: Subject to any disclaimer, the term of this patent is extended or adjusted under 35 U.S.C. 154(b) by 0 days.

(21) Appl. No.: 14/953,226

(22) Filed: Nov. 27, 2015

(65) Prior Publication Data

US 2016/0079098 A1 Mar. 17, 2016

Related U.S. Application Data

(62) Division of application No. 13/578,117, filed as application No. PCT/JP2011/000713 on Feb. 9, 2011.

(30) Foreign Application Priority Data

Mar. 16, 2010 (JP) .................................. 2010-058629

(51) Int. Cl.
*B29C 65/00* (2006.01)
*B32B 37/00* (2006.01)
(Continued)

(52) U.S. Cl.
CPC ...... *H01L 21/67132* (2013.01); *H01L 21/6836* (2013.01); *H01L 21/6838* (2013.01)

(58) Field of Classification Search
CPC ... H01L 21/00; H01L 21/02; H01L 21/02104; H01L 21/50; H01L 21/52; H01L 21/67; H01L 21/67132; H01L 21/67253; H01L 21/021107; H01L 24/50; B29C 65/00; B29C 65/48; B29C 65/4845; B29C 65/50; B29C 65/524; B29C 66/00; B29C 66/001; B29C 66/00145; B32B 37/00; B32B 37/10; B32B 37/1018; B32B 37/12; B32B 37/1284; B32B 37/16; B32B 2037/1253
See application file for complete search history.

(56) References Cited

U.S. PATENT DOCUMENTS 5,307,568 A * 5/1994 Matsuo ............... C23C 16/4401
34/402

FOREIGN PATENT DOCUMENTS

CN 1954419 A 4/2007
JP H 06-086342 U 12/1994
(Continued)

OTHER PUBLICATIONS

Sugano, Hidemi. "Vacuum Tape Pasting Equipment and Method Therefor." Jan. 2005. Japanese Patent Office. Detailed Description.*
Nakamura, Yoshio. "Method and Device for Adhering Wafer." Japanese Patent Office. Detailed Description.
(Continued)

*Primary Examiner* — Michael N Orlando
*Assistant Examiner* — Matthew Hoover
(74) *Attorney, Agent, or Firm* — McGinn IP Law Group PLLC

(57) ABSTRACT

A tape attaching apparatus includes: a chamber having an airtight space formed therein; a rubber sheet that partitions the airtight space into first and second airtight spaces and has an upper sheet on which a wafer is placed; a tape frame that holds a tape above the rubber sheet; and first and second supply/exhaust tubes that switch pressurization and depressurization of the first and second airtight spaces. In pressurizing the second airtight space and expanding the rubber sheet to lift the wafer to be attached to the tape, after bringing the first and second airtight spaces into a vacuum state, the wafer is attached to the tape while an amount of pressurization of the second airtight space is controlled to change an expansion rate of the rubber sheet from a low speed to a high speed stepwisely.

18 Claims, 18 Drawing Sheets

(51) Int. Cl.
 *H01L 21/00* (2006.01)
 *H01L 21/67* (2006.01)
 *H01L 21/683* (2006.01)

(56) References Cited

FOREIGN PATENT DOCUMENTS

| JP | H 10-233430 A | | 9/1998 |
|---|---|---|---|
| JP | H 11245163 | | 9/1999 |
| JP | 2001-284218 A | | 10/2001 |
| JP | 2005-026377 | | 1/2005 |
| JP | 2005026377 | * | 1/2005 |
| JP | 2008-66597 A | | 3/2008 |
| JP | 4143488 B2 | | 9/2008 |

OTHER PUBLICATIONS

Sugano, Hidemi. "Vacuum Tape Pasting Equipment and Method Therefor." Japanese Patent Office. Detailed Description.
Chinese Office Action dated Jul. 21, 2014 with an English translation thereof.
International Search Report in PCT/JP2011/000713 dated Apr. 19, 2011 (English Translation thereof).
Korean Office Action dated Oct. 25, 2013, with partial English translation.
Japanese Notice of Reasons for Rejection dated Mar. 12, 2012 with English Translation.
U.S. Office Action in U.S. Appl. No. 13/578,117 dated Aug. 6, 2015.
U.S. Office Action in U.S. Appl. No. 13/578,117 dated Mar. 2, 2015.
U.S. Office Action in U.S. Appl. No. 13/578,117 dated Sep. 19, 2014.
U.S. Office Action in U.S. Appl. No. 13/578,117 dated Oct. 27, 2015.

* cited by examiner

Fig. 8　NITROGEN INJECTION

LOW-SPEED ATTACHMENT

MEDIUM-SPEED ATTACHMENT

HIGH-SPEED ATTACHMENT

RUBBER SHRINKAGE

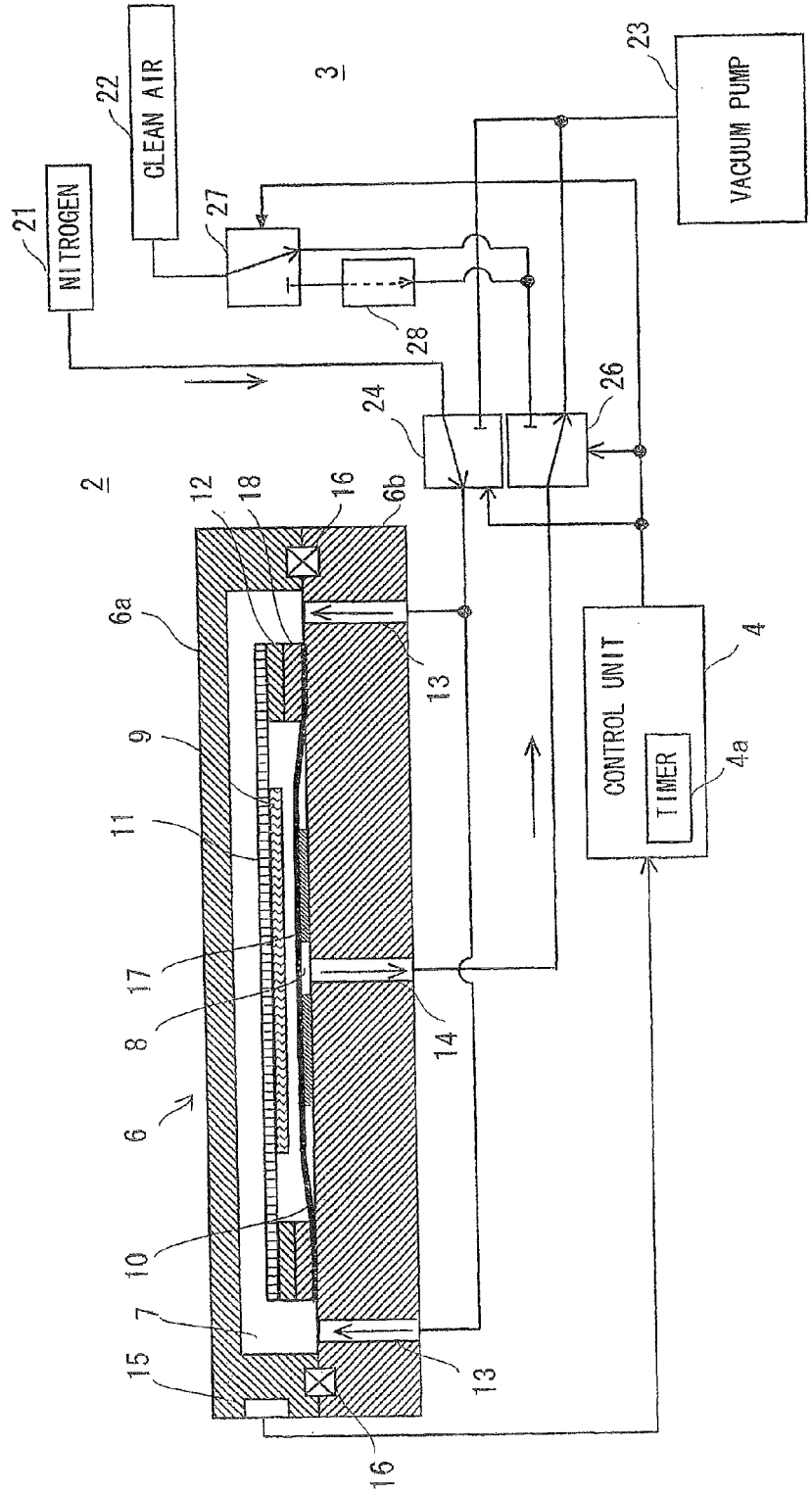

TAPE ATTACHING APPARATUS AND TAPE ATTACHING METHOD

This application is a Divisional Application of U.S. patent application Ser. No. 13/578,117, filed Aug. 9, 2012, which is based on Japanese Patent Application No. 2010-058629, filed on Mar. 16, 2010 and International Application No. PCT/JP2011/000713, filed on Feb. 9, 2011, the entire contents of which is incorporated herein by reference.

TECHNICAL FIELD

The present invention relates to a tape attaching apparatus and a tape attaching method for use in attaching a dicing tape to a semiconductor wafer, and more particularly, to an apparatus suitable for attaching a tape to an attachment target object having a low rigidity, for example.

BACKGROUND ART

In the case of attaching a dicing tape to a semiconductor wafer during a semiconductor manufacturing process, for example, as shown in FIG. 17, a wafer 42 is placed on a base 41 and a tape 43 is pressed from above to be attached by a roller 44 having rubber attached to the surface thereof, a block having a cylindrical shape, or the like. However, since this method is carried out in the atmosphere, air is liable to be entrapped between the wafer 42 and the tape 43. When dicing (chip segmentation) is performed in such a state, cracking or chipping occurs in the chip.

In this regard, an attaching apparatus for attaching a tape under a vacuum environment is proposed. For example, Patent Literature 1 discloses a tape attaching apparatus 50 including a chamber 52 having an airtight space 51 formed therein; a rubber sheet 56 which partitions the airtight space 51 into first and second airtight spaces 53 and 54 and has an upper surface on which a wafer 55 is placed; a frame base 58 which holds a tape 57 above the rubber sheet 56; and first and second airflow paths 59 and 60 which respectively switch the first and second airtight spaces 53 and 54 into a vacuum/atmosphere state, as shown in FIG. 18.

In the tape attaching apparatus 50, the first and second airtight spaces 53 and 54 are brought into the vacuum state and only the second airtight space 54 is then switched to the state under atmospheric pressure, thereby producing a differential pressure between the first and second airtight spaces 53 and 54. This allows the rubber sheet 56 to expand to lift the wafer 55, thereby allowing the wafer 55 to contact an adhesive surface (back surface) of the tape 57. According to this tape attaching apparatus 50, it is possible to bond the tape 57 and the wafer 55 together under a vacuum environment, thereby preventing air from being entrapped between the tape and the wafer.

CITATION LIST

Patent Literature

Japanese Patent No. 4143488

SUMMARY OF INVENTION

Technical Problem

As described above, according to the tape attaching apparatus disclosed in Patent Literature 1, it is possible to prevent air from being entrapped between the wafer and the tape. However, in addition to such ability, there is a demand for an attaching apparatus capable of reducing a load on the wafer which is applied upon attachment of a tape.

In other words, along with miniaturization of electronic equipment, for example, ultrathin semiconductor chips including circuits that have been miniaturized are in widespread use. As a matter of course, also wafers on which the semiconductor chips are formed have been rapidly reduced in thickness. Such thin wafers are originally low in strength, and warpage is liable to occur in the wafers. Thus, the wafers are extremely susceptible to pressing or impact from above or below, which may cause cracking or chipping occurs during attachment of a tape. In the case of using a chip for a sensor, a fragile structure (for example, a micro mirror that reflects light) can be mounted on the chip. Also in this case, there is a possibility that the structure is damaged during attachment of a tape. For this reason, careful handling is required.

Such a problem occurs not only in the case of attaching a tape to a wafer, but also in the case of attaching a tape to an attachment target object having a low rigidity, more specifically, in the case of attaching a tape to an ultrathin glass sheet, for example, in substantially the same way.

Therefore, the present invention has been made in view of the above-mentioned problems inherent in the related art, and it is an object of the present invention to provide a tape attaching apparatus capable of reducing a load on an attachment target object and preventing breakage or damage of the attachment target object in the case of attaching a tape to an attachment target object having a low rigidity.

Solution to Problem

To achieve the above-mentioned object, a tape attaching apparatus according to an aspect of the present invention includes: a container having an airtight space formed therein; an elastic sheet that partitions the airtight space into a first airtight space positioned above and a second airtight space positioned below, a tape attachment target object being placed in the first airtight space; a tape holding member that holds a tape in the first airtight space and positions the tape at a predetermined distance from the tape attachment target object placed on the elastic sheet; and atmospheric pressure switching means for switching pressurization and depressurization of the first and second airtight spaces. When the tape attaching apparatus pressurizes the second airtight space and expands the elastic sheet to lift the tape attachment target object to be attached to the tape, after bringing the first and second airtight spaces into a vacuum state, the tape attaching apparatus causes the tape attachment target object to be attached to the tape while controlling an amount of pressurization of the second airtight space to change an expansion rate of the elastic sheet from a low speed to a high speed in a stepwise fashion.

A tape attaching method according to another aspect of the present invention uses a tape attaching apparatus including: a container having an airtight space formed therein; an elastic sheet that partitions the airtight space into a first airtight space positioned above and a second airtight space positioned below, a tape attachment target object being placed in the first airtight space; a tape holding member that holds a tape in the first airtight space and positions the tape at a predetermined distance from the tape attachment target object placed on the elastic sheet; and atmospheric pressure switching means for switching pressurization and depressurization of the first and second airtight spaces, the method including: causing the tape attachment target object to be attached to the tape while controlling an amount of pressurization of the second airtight space to change an expansion rate of the elastic sheet from a low speed to a high speed in a stepwise fashion, upon pressurizing the second airtight space and expanding the elastic sheet to lift the tape attachment target object to be attached to the tape, after bringing the first and second airtight spaces into a vacuum state.

Advantageous Effects of Invention

As described above, according to the present invention, it is possible to reduce a load on an attachment target object and prevent breakage or damage of the attachment target object in the case of attaching a tape to an attachment target object having a low rigidity.

BRIEF DESCRIPTION OF DRAWINGS

FIG. 15 is a chart showing a rubber planarization process in the case of attaching a tape;

DESCRIPTION OF EMBODIMENTS

Next, modes for carrying out the invention will be described in detail with reference to the drawings. Herein, an example is described in which a tape attaching apparatus according to the present invention is applied to attachment of a dicing tape to a semiconductor wafer.

Figure 1:
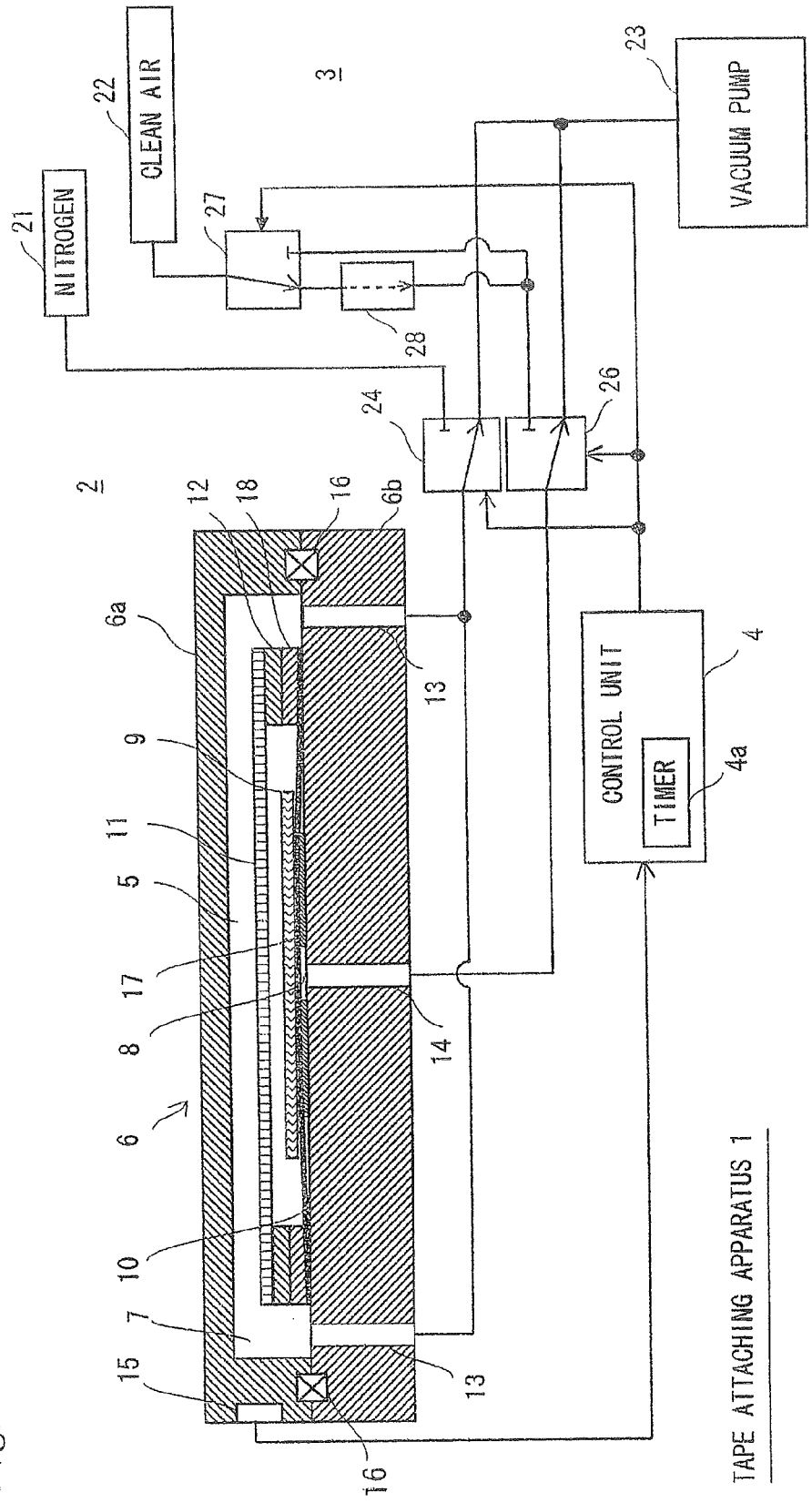
FIG. 1 is a sectional view showing an exemplary embodiment of a tape attaching apparatus according to the present invention.

FIG. 1 shows an exemplary embodiment of the tape attaching apparatus according to the present invention. This tape attaching apparatus 1 is broadly divided into an apparatus main body 2, a supply/exhaust mechanism 3 which supplies air (clean air) and nitrogen to the apparatus main body 2 and sucks air or the like from the apparatus main body 2, and a control unit 4 which controls timings for supplying/discharging air or the like.

The apparatus main body 2 is an apparatus for performing an attachment operation. The apparatus main body 2 is formed in a cylindrical shape. This apparatus main body 2 includes a chamber (container) 6 having an airtight space 5 formed therein; a rubber sheet 10 which partitions an airtight space 5 into a first airtight space 7 and a second airtight space 8 and which has an upper surface on which a disc-like wafer 9 is placed; a tape frame 12 which holds a tape 11 above the rubber sheet 10; a first supply/exhaust tube 13 for supplying nitrogen to the first airtight space 7 and sucking air from the first airtight space 7; a second supply/exhaust tube 14 for supplying air to the second airtight space 8 and sucking air from the second airtight space 8; and a vacuum sensor 15 which detects the degree of vacuum of the airtight space 5.

The chamber 6 includes an upper chamber (top cover) 6a and a lower chamber (base) 6b which are formed by dividing the chamber 6 into two chambers. A recess which is recessed upward is formed within the upper chamber 6a. Between the upper and lower chambers 6a and 6b, a seal ring 16 for securing the airtightness of the airtight space 5 is disposed.

Figure 2A:
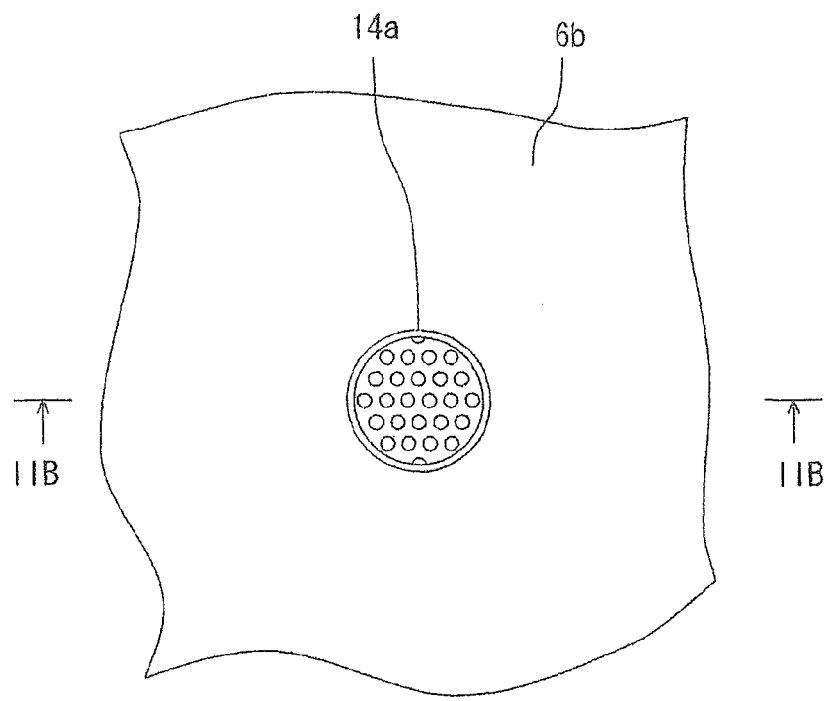
FIG. 2A is an enlarged top view showing an opening of a second supply/exhaust tube shown in FIG. 1.
Figure 2B:
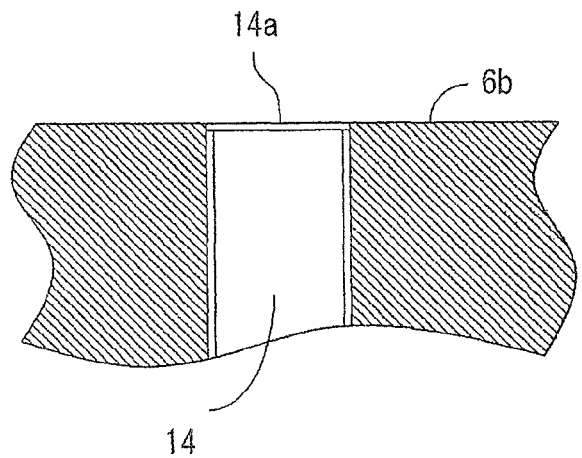
FIG. 2B is a sectional view taken along the line IIB-IIB of FIG. 2A.

The first and second supply/exhaust tubes 13 and 14 are laid in the lower chamber 6b. Of these tubes, the second supply/exhaust tube 14 has an opening attached with a mesh cover 14a having a number of small holes formed therein as shown in FIGS. 2A and 2B.

Figure 3A:
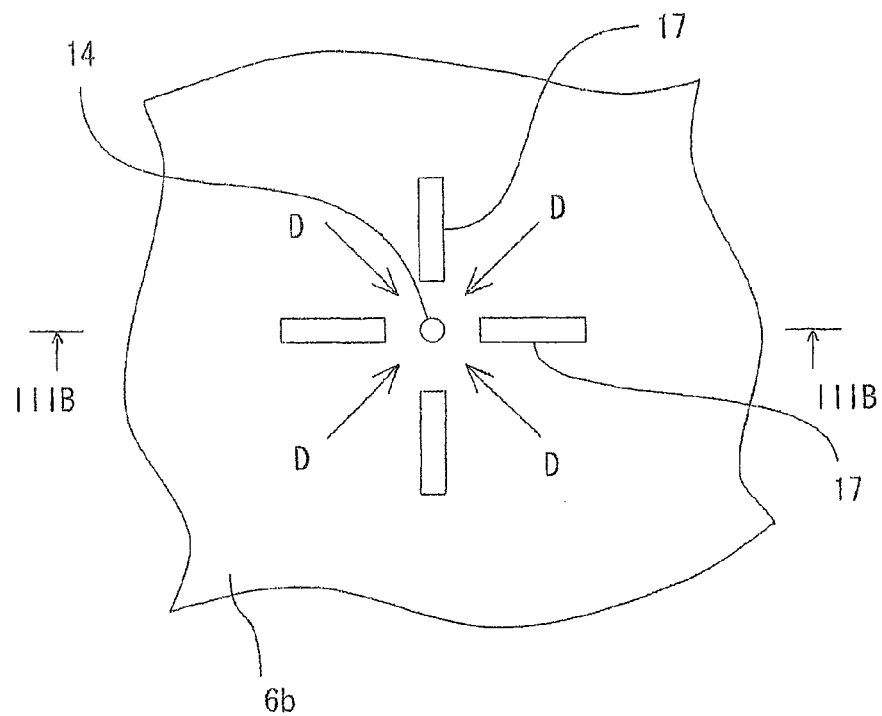
FIG. 3A is an enlarged top view of each spacer shown in FIG. 1.
Figure 3B:
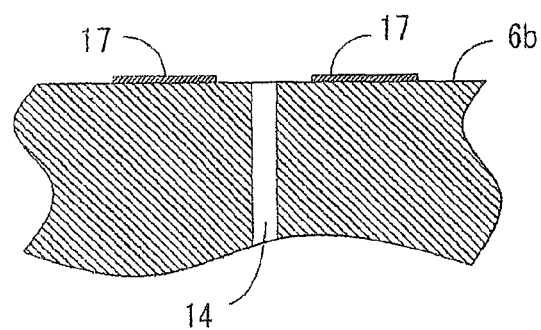
FIG. 3B is a sectional view taken along the line IIIB-IIIB of FIG. 3A.

Further, as shown in FIG. 1, a plurality of spacers 17 each having a predetermined height is formed on the upper surface of the lower chamber 6b. These spacers 17 are arranged in a cross shape with the opening of the second supply/exhaust tube 14 as a center as shown in FIGS. 3A and 3B.

Furthermore, the extensible rubber sheet 10 is disposed on the upper surface of the lower chamber 6b as shown in FIG. 1. The rubber sheet 10 is preferably formed of an elastic body having excellent gas barrier properties, such as chloroprene rubber or ethylene-propylene rubber, for example. Note that also the spacers 17 are preferably formed of the same material as that of the rubber sheet 10 so as to prevent the rubber sheet 10 from being damaged.

Figure 4A:
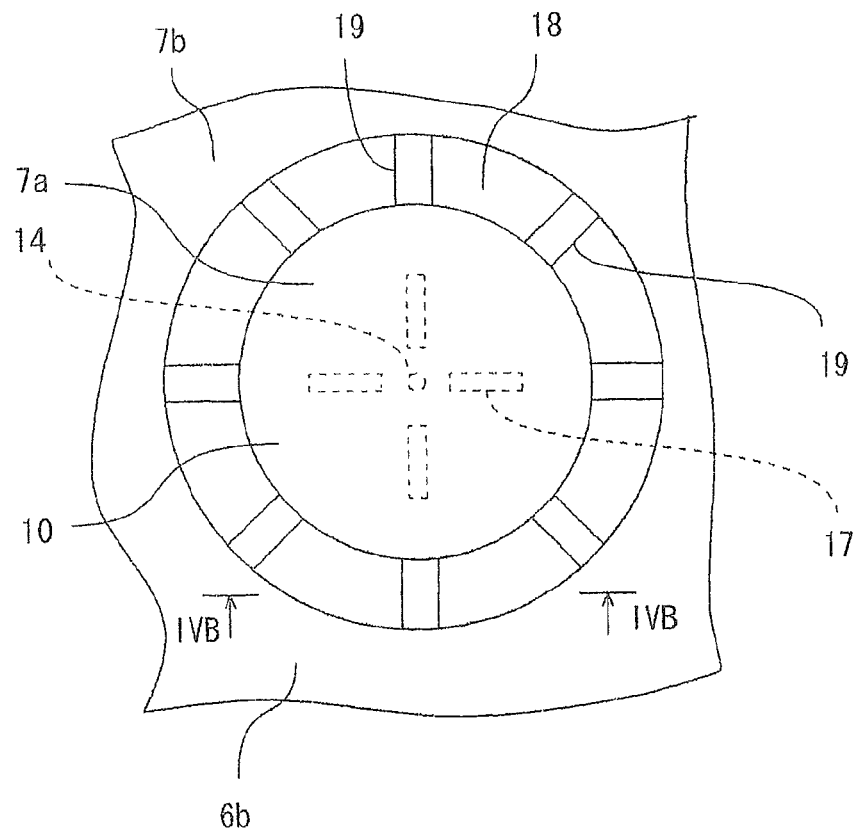
FIG. 4A is an enlarged top view showing a rubber sheet and a pressing ring shown in FIG. 1.
Figure 4B:
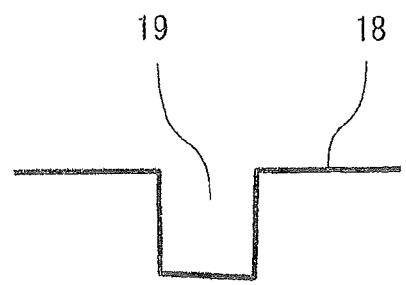
FIG. 4B is a sectional view taken along the line IVB-IVB of FIG. 4A.

As shown in FIG. 4A, a pressing ring 18 having an annular shape when viewed from the upper surface is disposed on a peripheral portion of the rubber sheet 10. The pressing ring 18 is screwed into the lower chamber 6b, thereby fixing the rubber sheet 10. The pressing ring 18 has a plurality of grooves 19 formed therein as shown in FIGS. 4A and 4B. These grooves 19 allow an inside space 7a and an outside space 7b of the pressing ring 18 to communicate with each other. Note that the grooves 19 may be formed in the tape frame 12, which will be described later, or may be formed in both the pressing ring 18 and the tape frame 12.

As shown in FIG. 1, the tape frame 12 having an annular shape when viewed from the upper surface is placed on the upper surface of the pressing ring 18. The tape 11 having a back surface coated with an adhesive, such as a UV curable resin or thermosetting resin, is attached to the upper surface of the tape frame 12. The tape 11 is attached under a certain tension, which prevents distortion or wrinkling of the tape 11.

Note that the attachment of the tape 11 is not limited to attachment to the upper surface of the tape frame 12. The tape 11 may be sandwiched between two frames from the front and back sides. Any mode may be employed as long as no distortion or wrinkling occurs in the tape 11.

The supply/exhaust mechanism 3 includes a nitrogen supply source 21 that supplies nitrogen; an air supply source 22 that supplies air; a vacuum pump 23 that sucks air or nitrogen; a first solenoid valve 24 disposed between both the nitrogen supply source 21 and the vacuum pump 23 and the first supply/exhaust tube 13; a second solenoid valve 26 disposed between both the air supply source 22 and the vacuum pump 23 and the second supply/exhaust tube 14; a third solenoid valve 27 disposed between the second solenoid valve 26 and the air supply source 22; and a flow control valve 28 disposed between the second solenoid valve 26 and the third solenoid valve 27.

The first solenoid valve 24 is provided to selectively connect the first supply/exhaust tube 13 to the nitrogen supply source 21 or the vacuum pump 23. The second solenoid valve 26 is provided to selectively connect the second supply/exhaust tube 14 to the third solenoid valve 27 or the vacuum pump 23. The third solenoid valve 27 is provided to selectively connect the second supply/exhaust tube 14 to the flow control valve 28 or the air supply source 22. The flow control valve 28 is provided to limit the flow rate of air.

The control unit 4 controls the operations of the first, second, and third solenoid valves 24, 26, and 27 according to an output of the vacuum sensor 15 and an output of a timer 4a incorporated in the control unit, and also controls the pressurization/depressurization of the first and second airtight spaces 7 and 8 of the apparatus main body 2.

Next, an attachment method using the tape attaching apparatus 1 having the structure as described above will be described with reference to FIGS. 1 to 15. Note that the case of using a UV curable resin as an adhesive of the tape 11 is herein described by way of example.

Referring first to FIG. 1, the second solenoid valve 26 is opened to the vacuum pump 23 side to bring the second airtight space (an airtight space positioned below the rubber sheet 10) 8 into a depressurized atmosphere. In this state, the upper chamber 6a is opened and the wafer 9 is placed at the center of the upper surface of the rubber sheet 10. Then, the back surface (adhesive surface) of the tape 11 is attached to the upper surface of the tape frame 12, and the tape frame 12 having the tape 11 attaching thereto is placed on the pressing ring 18.

Figure 7:
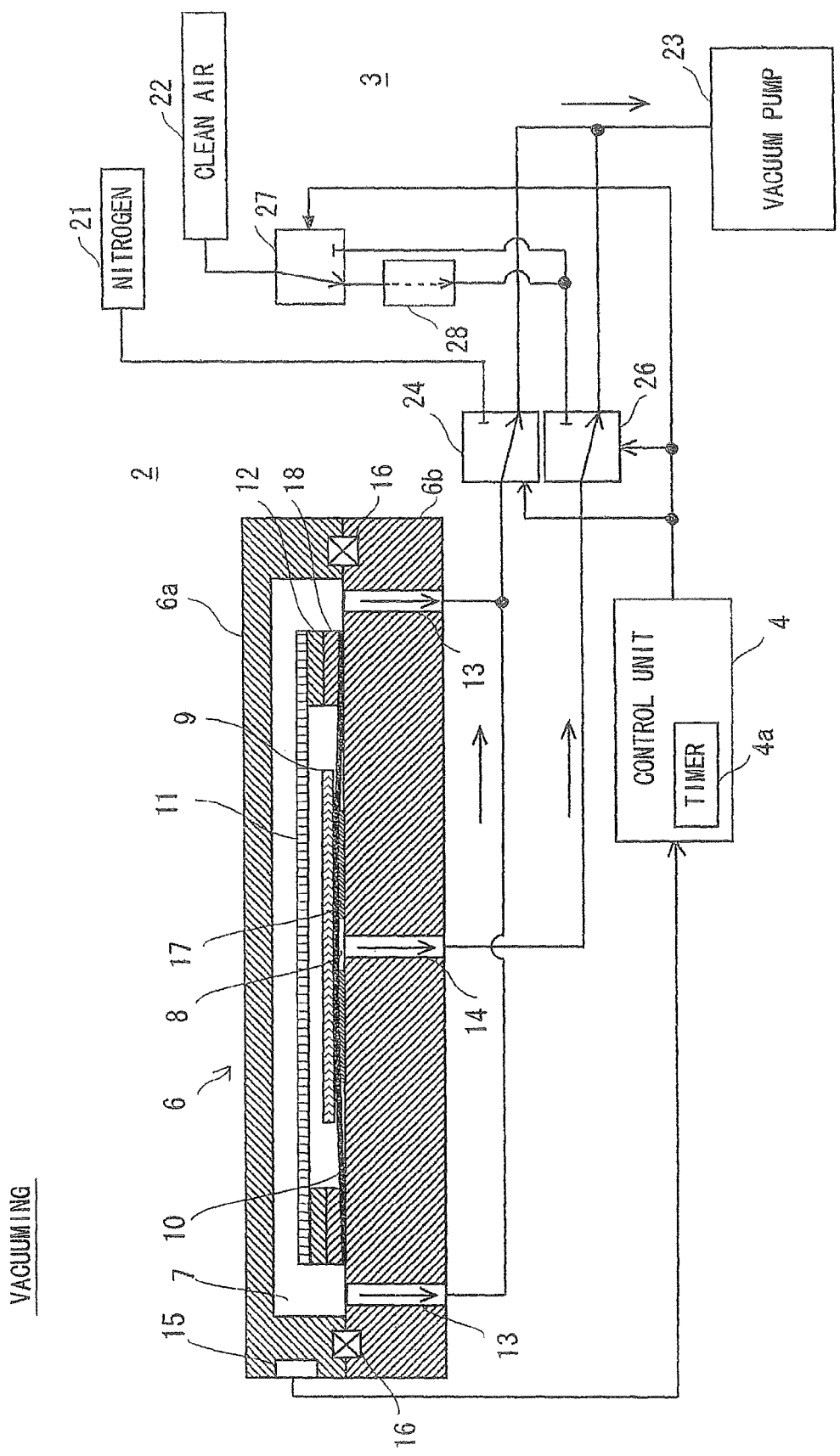
FIG. 7 is a chart showing a vacuum process in the case of attaching a tape.

After the upper chamber 6a is closed, the first solenoid valve 24 is opened to the vacuum pump 23 side and the first supply/exhaust tube 13 is connected to the vacuum pump 23 as shown in FIG. 7. This allows suction of air from the first airtight space (an airtight space positioned above the rubber sheet 10) 7 to be brought into a depressurized atmosphere (step S1 in FIG. 5).

Figure 8:
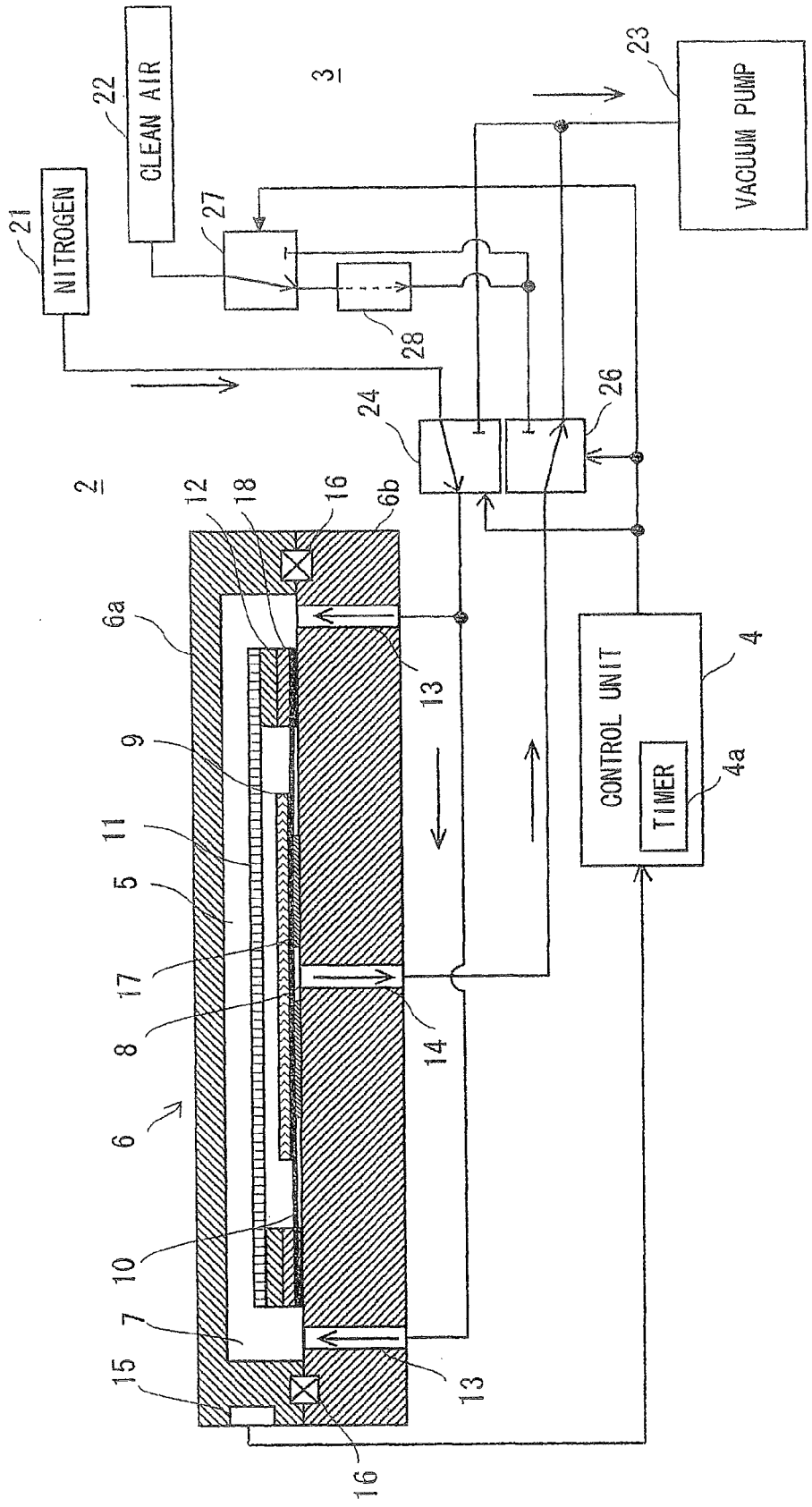
FIG. 8 is a chart showing a nitrogen injection process in the case of attaching a tape.

At this time, as shown in FIG. 8, the first solenoid valve 24 is intermittently opened to the nitrogen supply source 21 side to inject nitrogen into the first airtight space 7. This lowers the concentration of oxygen in the first airtight space 7 and promotes the attachment work under a low oxygen concentration environment.

In other words, since the UV curable resin is highly anaerobic, if an attaching process therefor is carried out under a high oxygen concentration environment, the curing action of the UV curable resin is lowered. Accordingly, uncured UV curable resin remains upon irradiation of ultraviolet rays in the subsequent process. This makes it difficult to peel off the chip in the case of peeling off the wafer 9 (chip), which is obtained after a dicing process, from the tape 11. For this reason, as described above, nitrogen is injected into the first airtight space 7 to lower the oxygen concentration, thereby preventing the curing action of the UV curable resin from being lowered.

Figure 9:
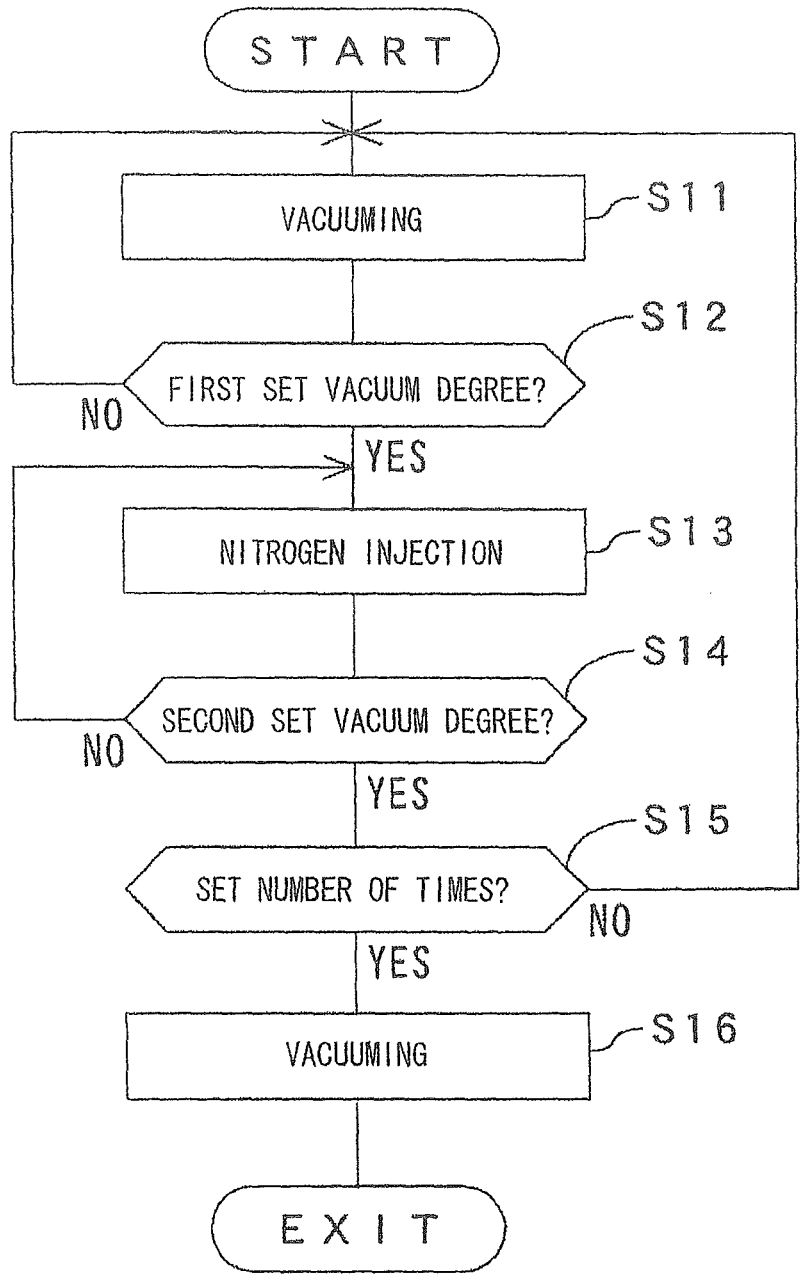
FIG. 9 is a sub-flowchart showing a nitrogen injection procedure in the vacuuming process.

The work for injecting nitrogen can be carried out as shown in FIG. 9. Specifically, when the degree of vacuum of the first airtight space 7 reaches a first set vacuum degree in the state where the air is sucked from the first airtight space 7, the first supply/exhaust tube 13 is connected to the nitrogen supply source 21 to inject nitrogen into the first airtight space 7 (steps S11 to S13). Then, nitrogen is continuously injected until the degree of vacuum of the first airtight space 7 reaches a second set vacuum degree. When the degree of vacuum reaches the second set vacuum degree, it is determined whether the number of times of injection of nitrogen reaches a set number of times (steps S14 to S15). As a result of the determination, when the number of times of injection reaches the set number of times, vacuuming is carried out again to suck nitrogen (step S16), and the first airtight space 7 is brought into a depressurized atmosphere in the state where the concentration of oxygen remaining in the first airtight space 7 is set to be equal to or lower than 1%. Here, the first set vacuum degree, the second set vacuum degree, and the set number of times can be arbitrarily set.

Note that, as described above, the process of injecting nitrogen is carried out in consideration of the properties of the UV curable resin. Accordingly, the process can be omitted when an adhesive other than the UV curable resin is used.

Figure 10:
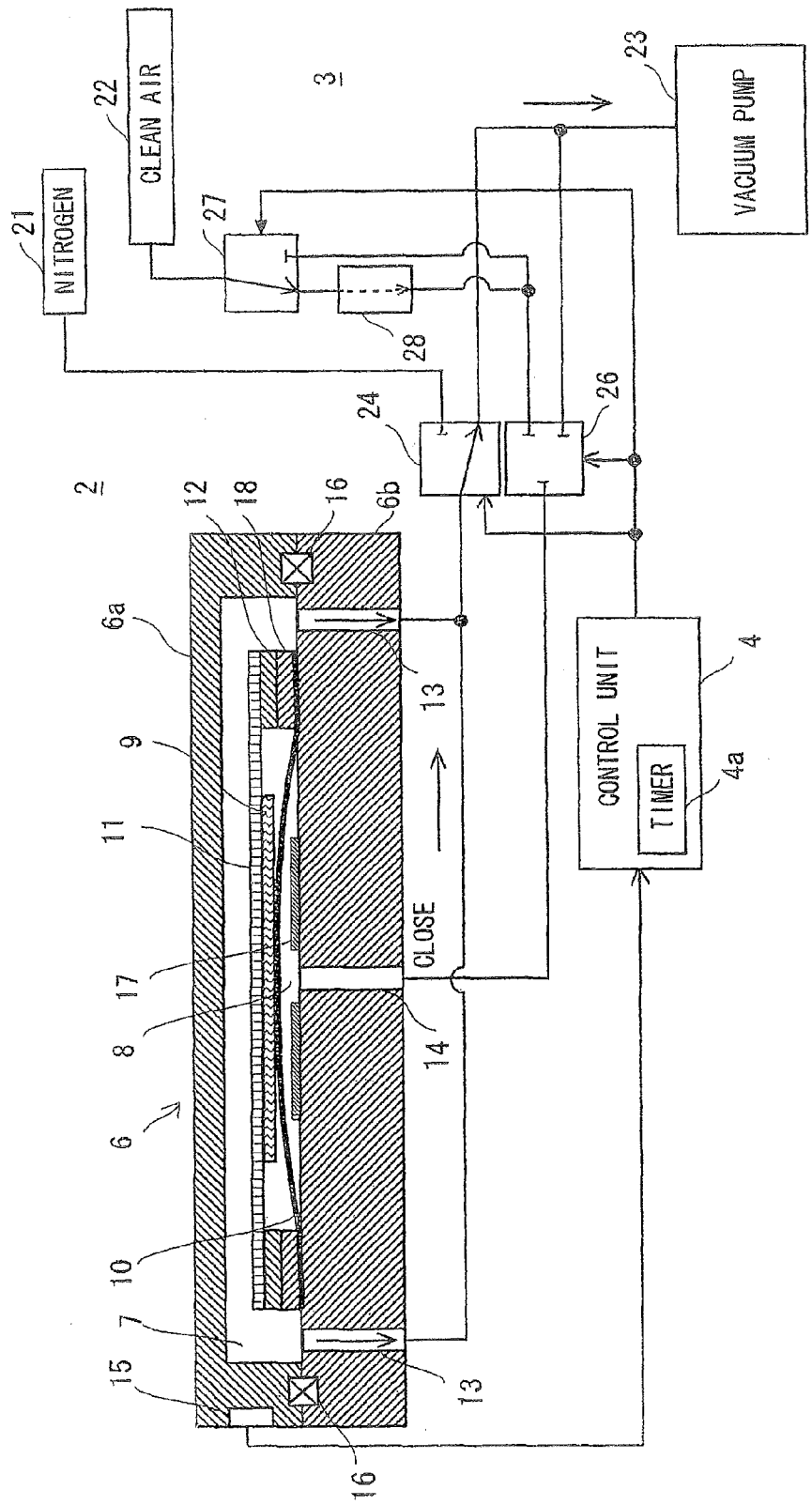
FIG. 10 is a chart showing a low-speed attaching process in the case of attaching a tape.

Next, as shown in FIG. 10, the second solenoid valve 26 is closed to close the second supply/exhaust tube 14 in the state where the vacuum pressure of the first airtight space 7 is held, thereby sealing the second airtight space 8. In this case, spontaneous leakage occurs and a certain amount of air flows into the second airtight space 8, so that a small differential pressure is generated between the first and second airtight spaces 7 and 8.

As a result, the rubber sheet 10 gradually expands to thereby slowly lift the wafer 9 placed on the rubber sheet 10. The lifting at low speed allows the wafer 9 to contact the adhesive surface of the tape 11 (step S2 in FIG. 5) so that the center of the wafer 9 first contacts the tape 11.

Specifically, in the case of placing the wafer 9 on an unstable base such as the rubber sheet 10, when the wafer 9 is lifted at high speed, the posture of the wafer 9 is disturbed or inclined, or the wafer 9 slides on the rubber sheet 10 and thus the position of the wafer is easily displaced. On the other hand, when the wafer 11 is lifted at low speed, the wafer 9 is allowed to contact the tape 9 while immovably maintaining the posture and position of the wafer 9, thereby making it possible to reliably perform the attaching process from the center of the wafer 9.

Figure 11:
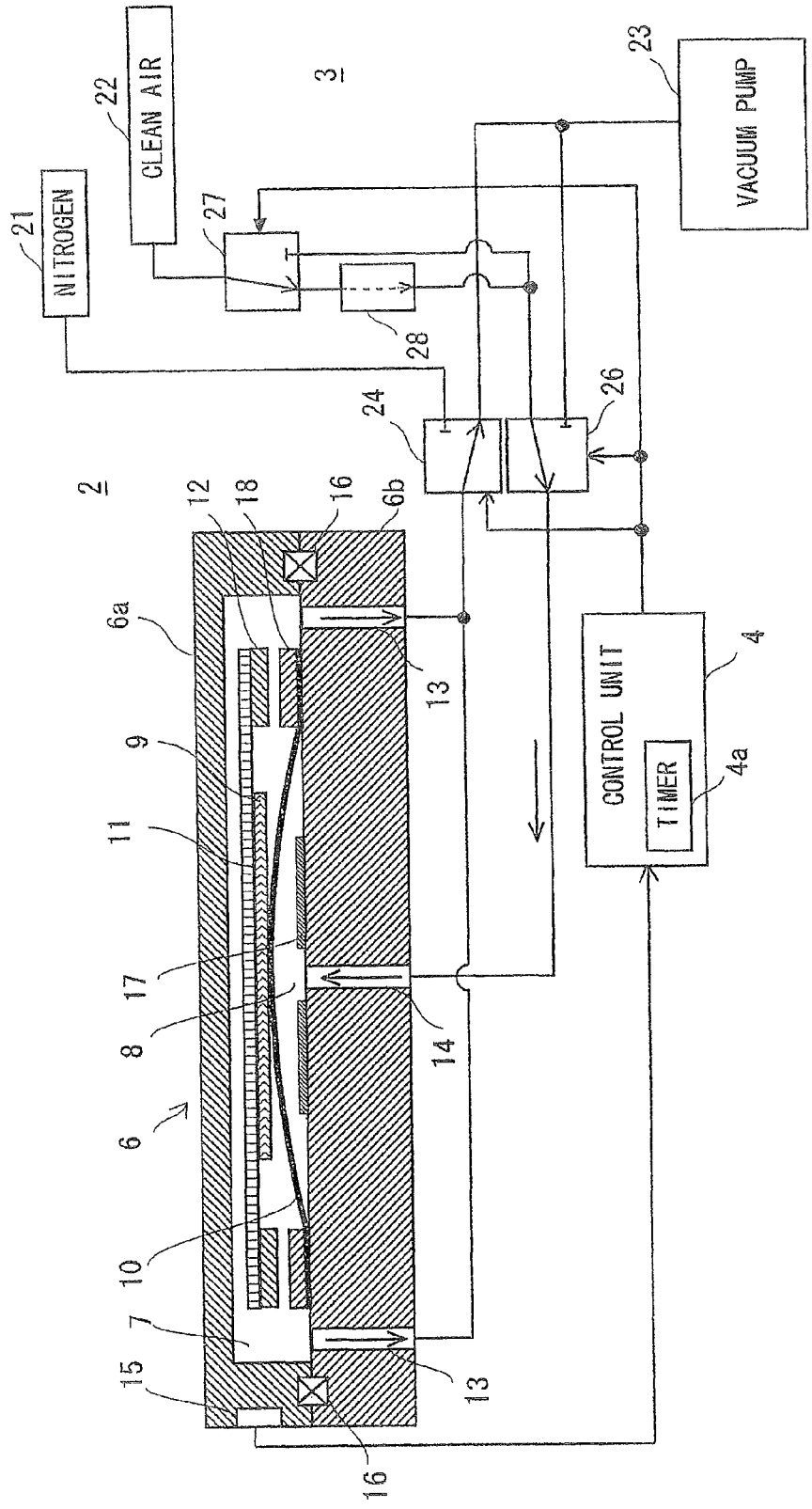
FIG. 11 is a chart showing a medium-speed attaching process in the case of attaching a tape.

Next, as shown in FIG. 11, the second solenoid valve 26 is opened to the air supply source 22 side and the third solenoid valve 27 is opened to the flow control valve 28 side, thereby supplying air to the supply/exhaust tube 14 in the state where the flow rate is limited. This allows the second airtight space 8 to be brought into a pressurized atmosphere and increases the differential pressure between the first and second airtight spaces 7 and 8, thereby changing the expansion rate of the rubber sheet 10 from a low speed to a medium speed (step S3 in FIG. 5).

Compared with a high-speed attaching process, which will be described later, the expansion rate of the rubber sheet 10 is slow and the pressure for lifting the wafer 9 is low in the medium-speed attaching process. In this process, the lifting of the wafer 9 to the tape 11 is carried out at a low pressure, thereby enlarging the attached area between the tape 11 and the wafer 9 without applying an excessive load to the wafer 9.

In a portion where the wafer 9 contacts the tape 11, the tape 11 is attached to the wafer 9 to reinforce the wafer 9, resulting in suppression of cracking or chipping of the wafer 9. This process is carried out to enlarge the reinforced area as described above, while minimizing the load on the wafer 9. The tape 11 and the tape frame 12 are lifted together with the wafer 9, and about 50 to 70% of the upper surface of the wafer 9 is allowed to contact the tape 11, for example.

Note that the expansion rate (expansion pressure) of the rubber sheet 10 during the medium-speed attaching process is set to a rate (expansion pressure) that allows the wafer 9 to be pressed against the tape 11 with a pressing pressure with which no breakage occurs. In this case, however, the pressing pressure with which no breakage occurs varies depending on the thickness, shape (condition of warpage), and the like of the wafer 9. Therefore, the rate during the actual operation is appropriately determined depending on the state of the wafer 9 to be used.

Figure 12:
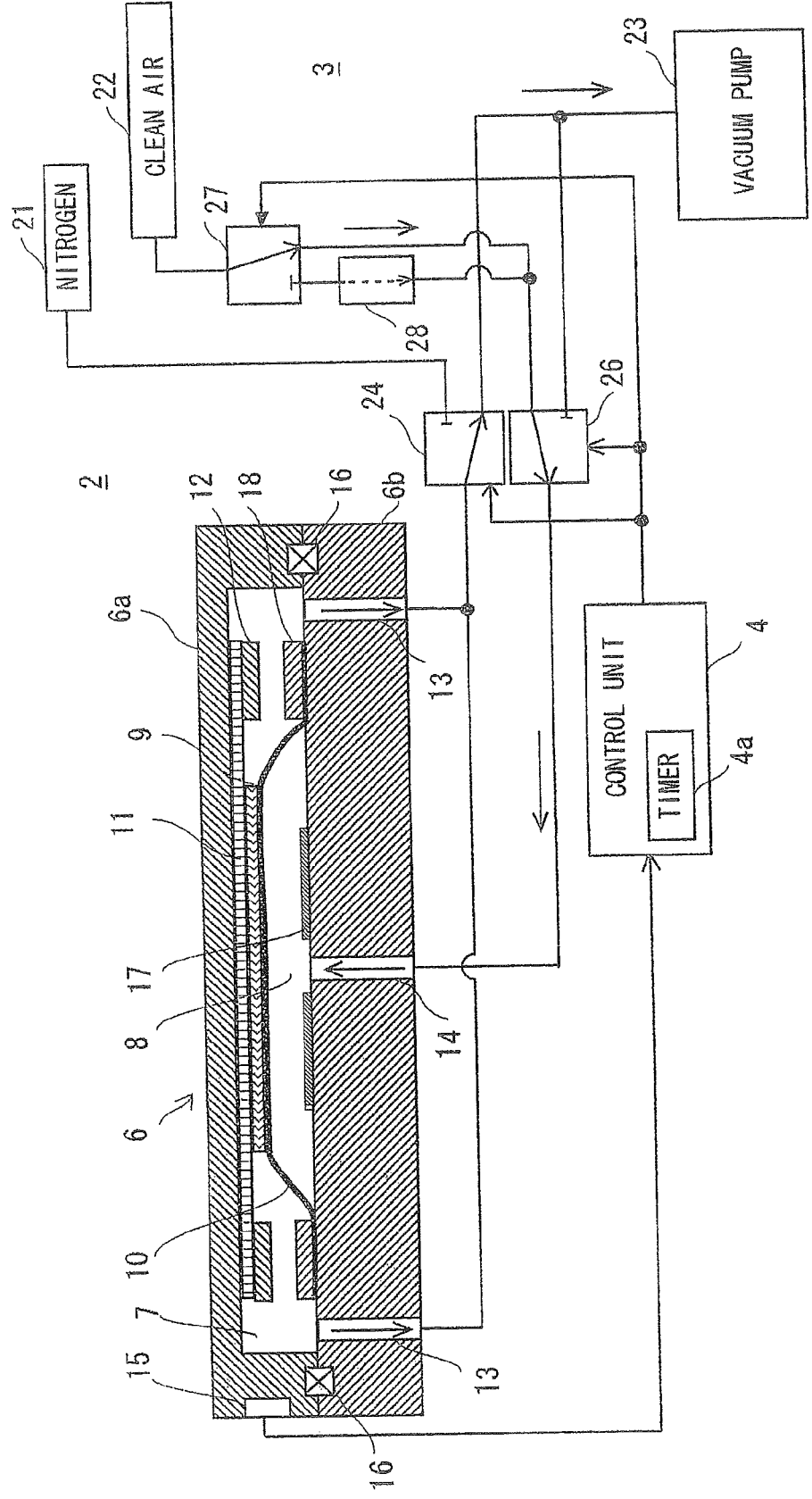
FIG. 12 is a chart showing a high-speed attaching process in the case of attaching a tape.

Then, when the attached area reaches about 50 to 70% of the wafer upper surface and when the risk of causing cracking or chipping of the wafer 9 is lowered, the third solenoid valve 27 is opened to the air supply source 22 side and the differential pressure between the first and second airtight spaces 7 and 8 is further increased as shown in FIG. 12. This allows the expansion rate of the rubber sheet 10 to change from the medium speed to the high speed (step S4 in FIG. 5) and increases the pressing pressure of the wafer 9 against the tape 11. The entire upper surface of the wafer 9 is attached to the tape 11 by the high-speed attaching process.

During the high-speed attaching process, the tape 11 and the wafer 9 are pressed against the ceiling surface of the upper chamber 6a to correct warpage of the wafer 9 and improve the adhesion properties between the wafer 9 and the tape 11. At this time, the tape 11 serves as a protective member that protects the upper surface of the wafer 9, thereby preventing the surface of the wafer 9 from being damaged.

The low-speed attaching process, the medium-speed attaching process, and the high-speed attaching process as described above can be switched by automatic control. For example, the switching can be made according to a lapse of time by using the timer 4a incorporated in the control unit 4.

Figure 13:
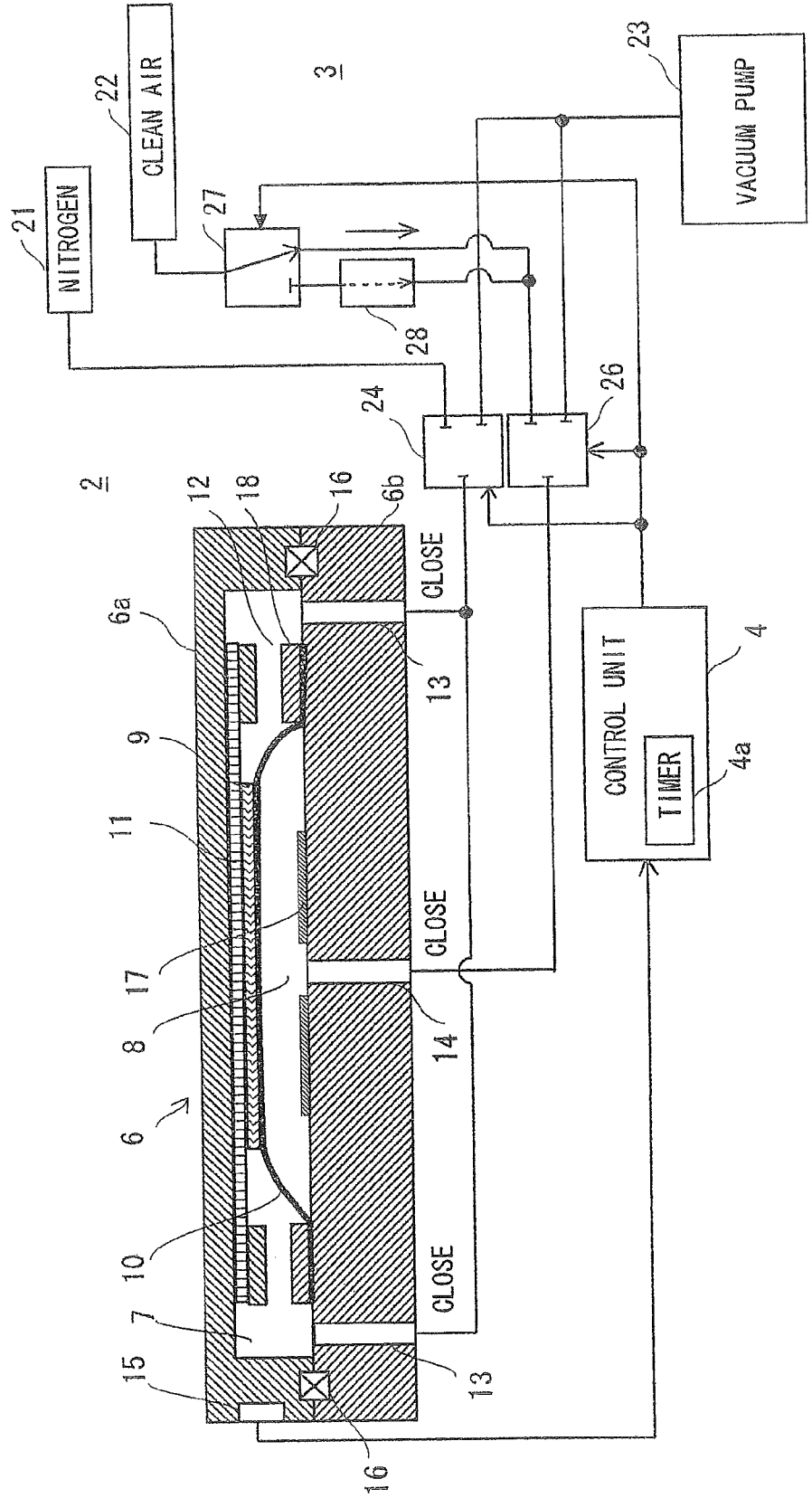
FIG. 13 is a chart showing a stabilization process in the case of attaching a tape.

Next, as shown in FIG. 13, the first and second solenoid valves 24 and 26 are closed and the first and second supply/exhaust tubes 13 and 14 are closed, thereby sealing the first and second airtight spaces 7 and 8. Thus, the state where the wafer 9 is pressed against the tape 11 is maintained over a predetermined period of time, thereby stabilizing the adhesion between the tape 11 and the wafer 9 (step S5 in FIG. 5).

Figure 14:
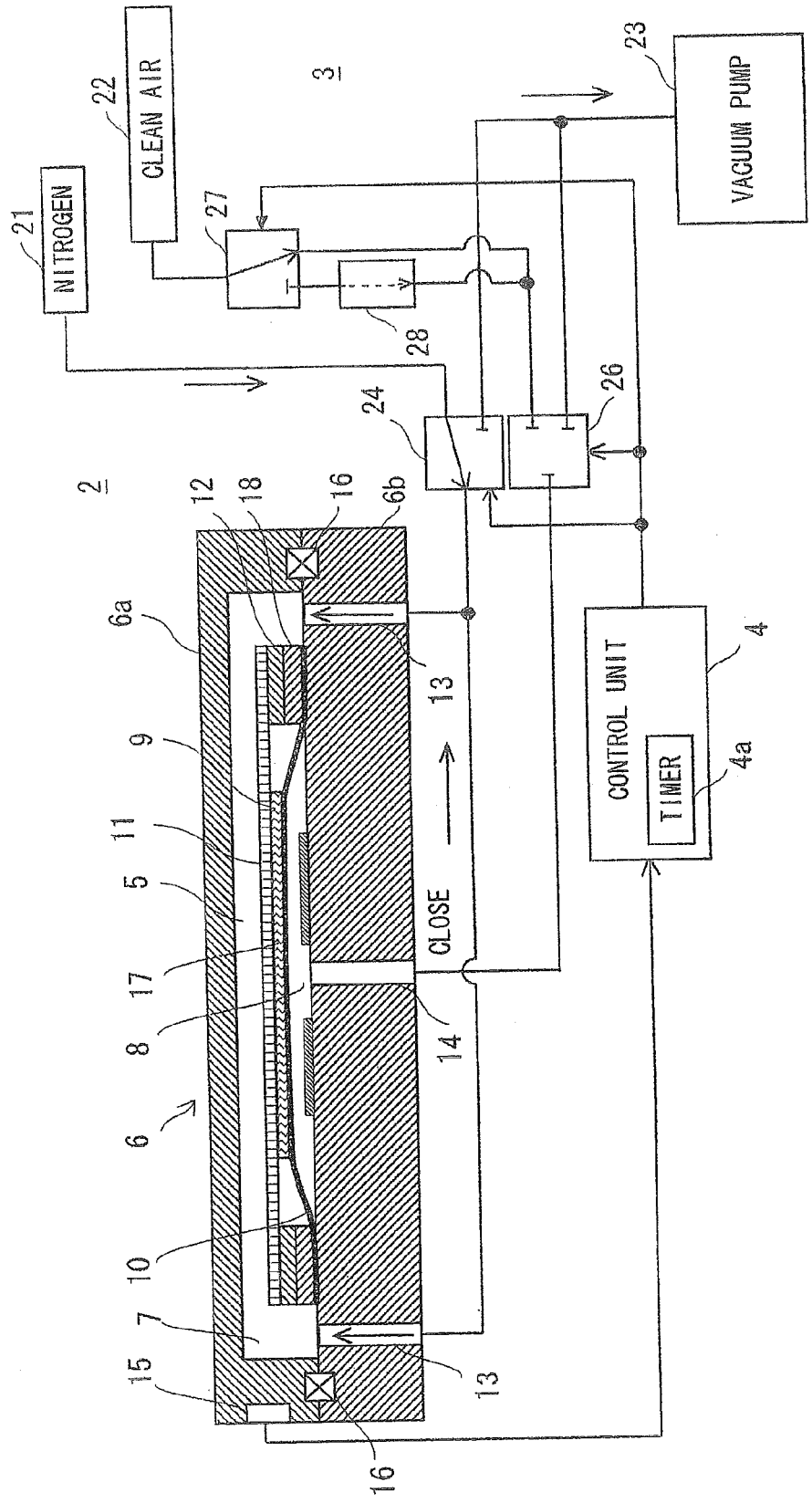
FIG. 14 is a chart showing a rubber shrinking process in the case of attaching a tape.

Next, as shown in FIG. 14, the first solenoid valve 24 is opened to the nitrogen supply source 21 side while the second solenoid valve 26 is closed, thereby supplying nitrogen to the first airtight space 7. This causes the rubber sheet 10 to shrink at low speed to thereby allow the tape 11, the wafer 9, and the tape frame 12 to gradually descend (step S6 in FIG. 5).

Then, the rubber sheet 10 is continuously allowed to shrink at low speed even after the tape frame 12 contacts the pressing ring 18, thereby gradually peeling the rubber sheet 10 from the lower surface of the wafer 9. This prevents a large tensile load from being applied to the wafer 9 when the rubber sheet 10 is peeled off.

Referring next to FIG. 15, the second solenoid valve 26 is opened to the vacuum pump 23 side to suck air from the second airtight space 8. As a result, the rubber sheet 10 is allowed to shrink and planarized at high speed (step S7 in FIG. 5). Lastly, the upper chamber 6a is opened to take out the tape 11 in the state of being attached with the wafer 9, together with the tape frame 12, thereby completing the work.

Figure 5:
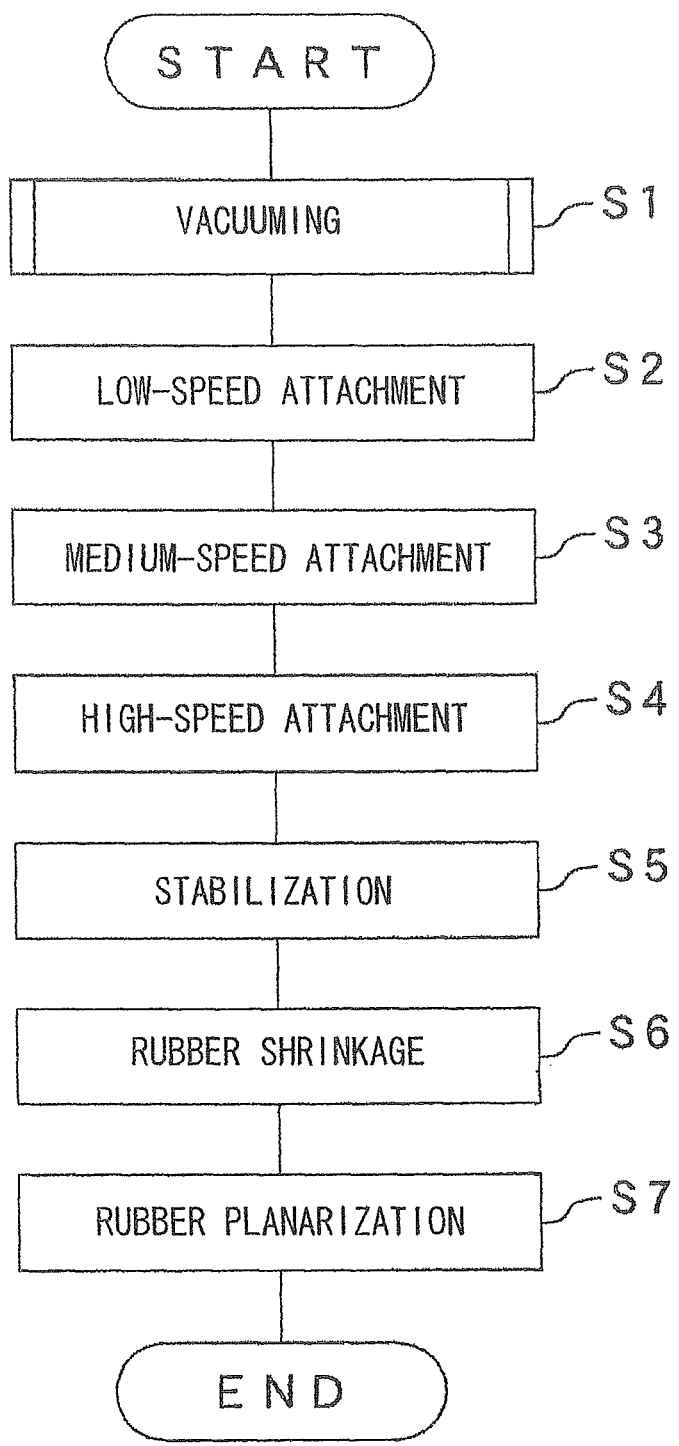
FIG. 5 is a main flowchart showing a procedure of a tape attaching method using the tape attaching apparatus shown in FIG. 1.
Figure 6:
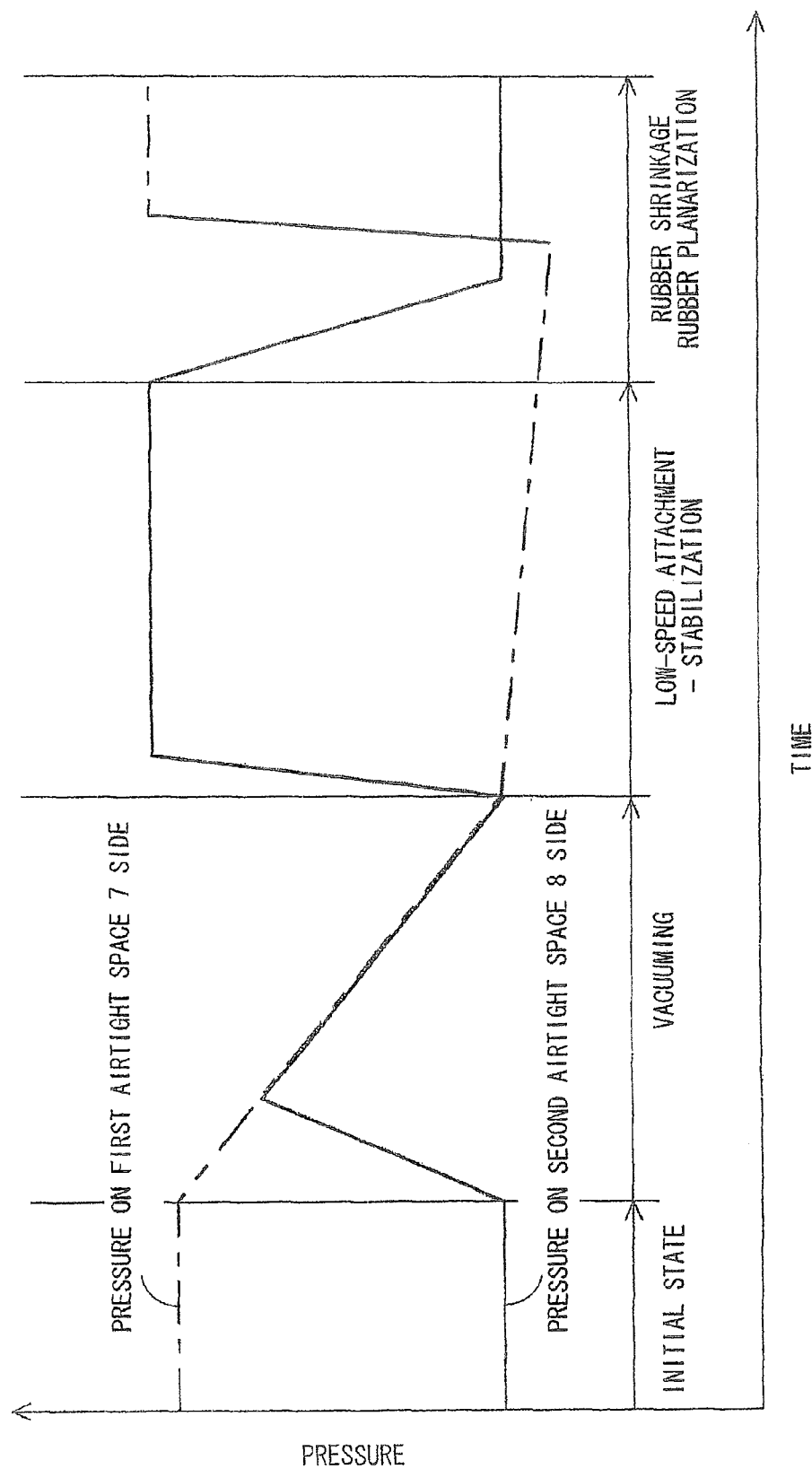
FIG. 6 is a diagram showing a state of a pressure transition of each of first and second airtight spaces.

As described above, according to this exemplary embodiment, in the case of attaching the wafer 9 to the tape 11, the wafer 9 is attached to the tape 11, while the expansion rate of the rubber sheet 10 is switched from the low speed to the high speed in a stepwise fashion as shown in FIG. 6 (steps S2 to S4 in FIG. 5), thereby enabling attachment in the state where the load on the wafer 9 is minimized. This enables attachment of the tape 11 while preventing breakage or damage from occurring in the wafer 9, even in the case of using the wafer 9 having a low rigidity.

Further, according to this exemplary embodiment, the low-speed attaching process is carried out and the center of the wafer 9 is allowed to first contact the tape 11. This enables attachment in order from the center of the wafer 9 toward the outer periphery thereof in the subsequent medium-speed attaching process and high-speed attaching process. Accordingly, even when there is air between the wafer 9 and the tape 11, it is possible to attach the wafer 9 to the tape 11 while letting the air escape to the outside, thereby preventing the air from being entrapped between the wafer and the tape.

Further, according to this exemplary embodiment, as shown in FIG. 3A, the plurality of spacers 17 arranged in a cross shape with the opening of the second supply/exhaust tube 14 as a center is formed on the upper surface of the lower chamber 6b. This makes it possible to prevent the air from remaining when the second airtight space 8 is brought into a depressurized atmosphere.

Figure 16A:
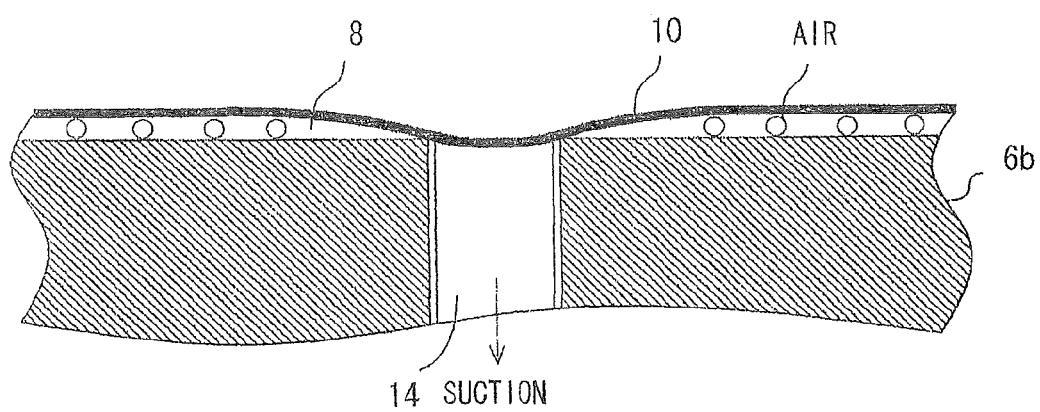
FIG. 16A is a diagram for explaining the operation and effect of the spacer shown in FIGS. 4A and 4B, and shows a mo-de in which the spacer is not provided.

Specifically, when the spacers 17 are not provided, as shown in FIG. 16A, the rubber sheet 10 is sucked into the second supply/exhaust tube 14 upon suction of air through the second supply/exhaust tube 14, so that the opening of the second supply/exhaust tube 14 is closed. As a result, the air cannot be sucked from the second airtight space 8 and the air remains.

When such a state occurs during vacuuming of step S1 in FIG. 5, for example, the second airtight space 8 is under positive pressure with respect to the first airtight space 7, which makes it difficult to completely planarize the rubber sheet 10. Further, since the second airtight space 8 is under positive pressure with respect to the first airtight space 7, when the process shifts to the low-speed attaching process of step S2 in FIG. 5 in this state, the rubber sheet 10 starts to expand at a relatively high speed upon releasing the suction of air from the second airtight space 8, and the wafer 9 is lifted at a speed higher than the intended speed. This occurs also when the process shifts to the medium-speed attaching process of step S3 in FIG. 5, which makes it difficult to appropriately control the pressing pressure of the wafer 9 against the tape 11.

Figure 16B:
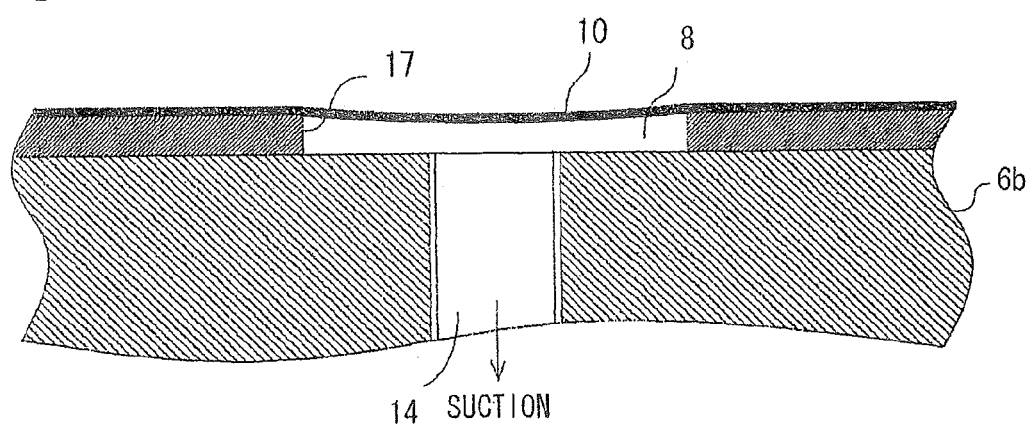
FIG. 16B is a diagram for explaining the operation and effect of the spacer shown in FIGS. 4A and 4B, and shows a mode in which the spacer is provided.
Figure 17:
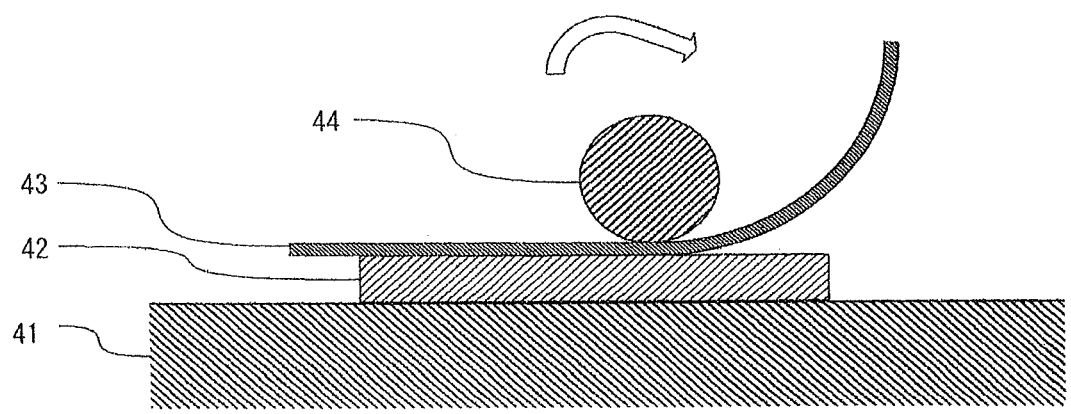
FIG. 17 is a diagram showing an example of a tape attaching method of related art.
Figure 18:
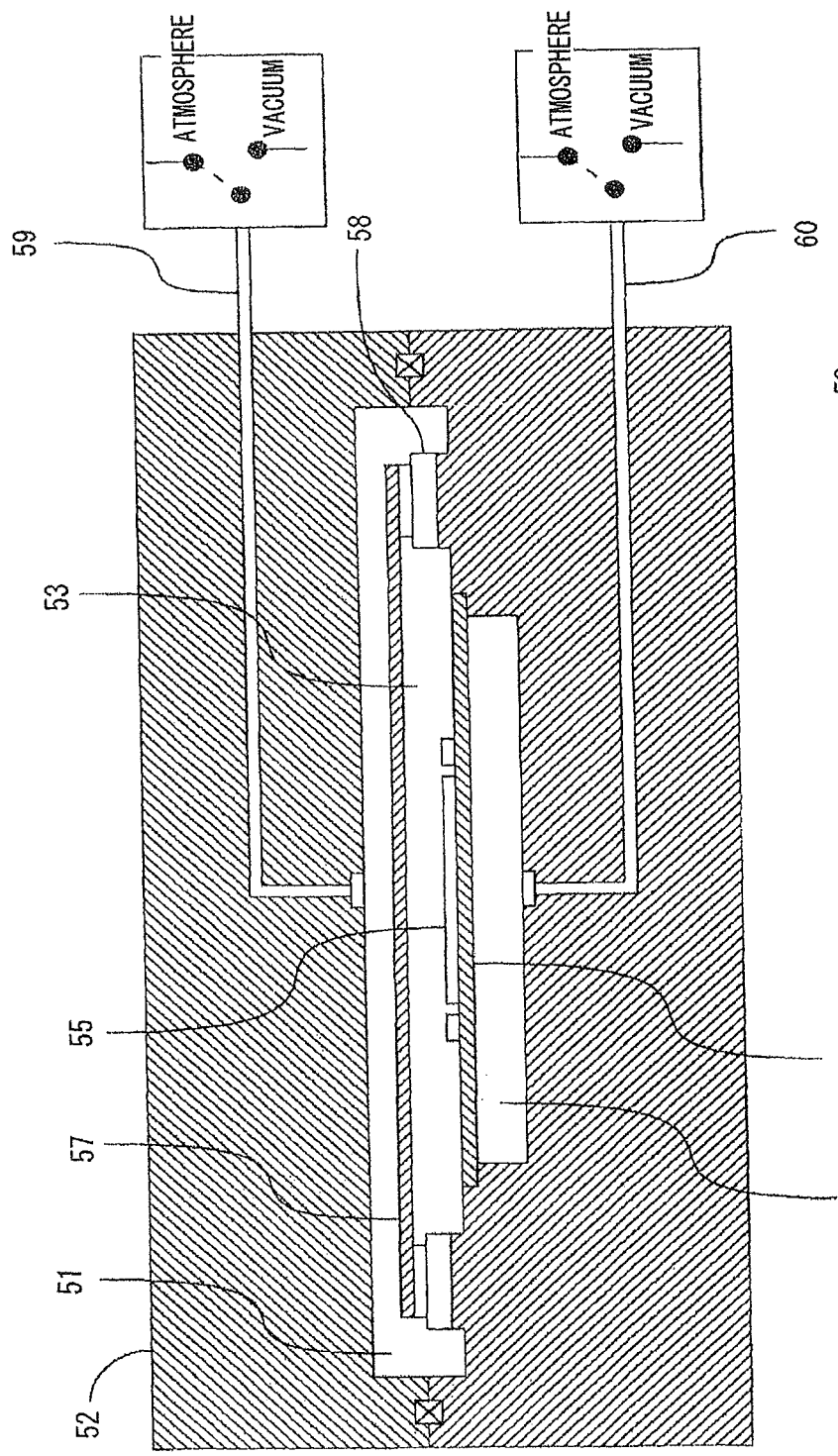
FIG. 18 is a diagram showing another example of the tape attaching method of related art.

On the other hand, when the spacers 17 are provided, as shown in FIG. 16B, the rubber sheet 10 contacts the spacers 17 to thereby hinder the suction of air into the second supply/exhaust tube 14, even if the air is sucked through the second supply/exhaust tube 14. At this time, the air within the second airtight space 8 flows into the second supply/exhaust tube 14 from each space between the adjacent spacers 17 as indicated by arrows D of FIG. 3A. This prevents the spacers 17 from hindering the suction of air from the second airtight space 8.

The provision of the spacers 17 in this manner prevents the air from remaining in the second airtight space 8 during vacuuming of step S1 in FIG. 5. This enables an appropriate control of the lifting speed of the wafer 9 and the pressing pressure of the wafer 9 against the tape 11 in the subsequent processes of steps S2 and S3.

Note that the height of each spacer 17 is not particularly limited and the height can be appropriately determined depending on the suction pressure of air from the second airtight space 8 and the material of the rubber sheet 10. Further, the arrangement shape of the spacers is not limited to a cross shape. For example, other shapes such as a radial shape with the opening of the second supply/exhaust tube 14 as a center, for example, may be used. More alternatively, the plurality of spacers 17 may be arranged in a discrete manner in the vicinity of the opening of the second supply/exhaust tube 14, with no particular regularity.

According to this exemplary embodiment, as shown in FIGS. 2A and 2B, the mesh cover 14a is attached to the opening of the second supply/exhaust tube 14. This makes it possible to enlarge the effective sectional area (the diameter of the second supply/exhaust tube 14) upon suction of air, while preventing the rubber sheet 10 from being sucked into the second supply/exhaust tube 14.

Though exemplary embodiments of the present invention have been described above, the present invention is not limited to the above-described structures and can be modified in various manners within the scope of the invention described in the claims.

For example, the exemplary embodiments illustrate, by way of example, the case where the tape attaching apparatus according to the present invention is applied to the attachment of a dicing tape to a semiconductor wafer. However, the present invention can be applied to a wide variety of cases, such as the case of attaching a protection tape to a glass sheet, in addition to the cases illustrated in the exemplary embodiments.

Further, in the above exemplary embodiments, the tape 11 is attached to the wafer 9 by switching the speed in three steps, i.e., the low-speed attaching process, the medium-speed attaching process, and the high-speed attaching process. However, when the wafer 9 has a sufficient thickness or when the material of the rubber sheet 10 hardly causes a slip, the low-speed attaching process may be skipped and the operation may be started from the medium-speed attaching process.

Furthermore, in the above exemplary embodiments, the rubber sheet 10 is slowly expanded by utilizing spontaneous leakage on the side of the second airtight space 8 during the low-speed attaching process. However, the utilization of spontaneous leakage is not essential, and the expansion rate of the rubber sheet 10 may be lowered by supplying a smaller amount of air than that for the medium-speed attaching process to the second airtight space 8.

Further, in the above exemplary embodiments, the first and second airtight spaces 7 and 8 are provided with the nitrogen supply source 21 and the air supply source 22, each of which serves as a supply source for supplying gas. However, gas other than nitrogen and air may also be used as the gas to be supplied to each of the first and second airtight spaces 7 and 8, as long as the pressurization and depressurization of the first and second airtight spaces 7 and 8 can be accomplished.

Furthermore, in the above exemplary embodiments, the apparatus main body 2, the rubber sheet 10, and the tape frame 12 are respectively formed into a cylindrical shape, a circular shape, and an annular shape to conform to a general shape of a semiconductor wafer. However, the shapes of the apparatus main body 2 and the like are not limited to these shapes, and other shapes such as a rectangular shape may be adopted, for example.

Moreover, in the above exemplary embodiments, the supply port for supplying gas and the suction port for sucking air are shared between the first and second airtight spaces 7 and 8, but these ports may be separately provided.

The whole or part of the exemplary embodiments disclosed above can be described as, but not limited to, the following supplementary notes.

Supplementary Note 1

A tape attaching apparatus comprising:
a container having an airtight space formed therein;
an elastic sheet that partitions the airtight space into a first airtight space positioned above and a second airtight space positioned below, a tape attachment target object being placed in the first airtight space;
a tape holding member that holds a tape in the first airtight space and positions the tape at a predetermined distance from the tape attachment target object placed on the elastic sheet; and
atmospheric pressure switching means for switching pressurization and depressurization of the first and second airtight spaces,
wherein the tape attaching apparatus pressurizes the second airtight space and expands the elastic sheet to lift the tape attachment target object to be attached to the tape, after bringing the first and second airtight spaces into a vacuum state, and the tape attaching apparatus causes the tape attachment target object to be attached to the tape while controlling an amount of pressurization of the second airtight space to change an expansion rate of the elastic sheet from a low speed to a high speed in a stepwise fashion, upon lifting of the tape attachment target object.

Supplementary Note 2

The tape attaching apparatus according to Supplementary note 1, wherein the elastic sheet is expanded at a first speed that allows the tape attachment target object to be pressed against the tape by a pressing force at which no breakage occurs, until a contact area between the tape attachment target object and the tape reaches a predetermined amount, and the expansion rate of the elastic sheet is then switched to a second speed to allow an entire attaching surface of the tape attachment target object to contact the tape, the second speed being higher than the first speed.

Supplementary Note 3

The tape attaching apparatus according to Supplementary note 2, wherein prior to the expansion of the elastic sheet at the first speed, the elastic sheet is expanded at a third speed to allow a center portion of the tape attachment target object to contact the tape, the third speed being lower than the first speed.

Supplementary Note 4

The tape attaching apparatus according to Supplementary note 3, wherein after the first and second airtight spaces are brought into a vacuum state, the second airtight space is closed with the vacuum state of the first airtight space maintained, to thereby expand the elastic sheet at the third speed.

Supplementary Note 5

The tape attaching apparatus according to Supplementary note 2, 3, or 4, wherein upon expansion of the elastic sheet at the second speed, the tape attachment target object and the tape are lifted and pressed against a ceiling surface of the airtight space in a state where the tape attachment target object and the tape contact each other.

Supplementary Note 6

The tape attaching apparatus according to any one of Supplementary notes 1 to 5, comprising spacers provided between a lower surface of the elastic sheet and a bottom surface of the airtight space, the spacers being arranged near an intake port for sucking gas from the second airtight space.

Supplementary Note 7

The tape attaching apparatus according to Supplementary note 6, wherein a plurality of the spacers is provided and arranged in one of a cross shape and a radial shape with the intake port as a center.

Supplementary Note 8

The tape attaching apparatus according to any one of Supplementary notes 1 to 7, wherein a mesh cover is attached to an intake port for sucking gas from the second airtight space.

Supplementary Note 9

The tape attaching apparatus according to any one of Supplementary notes 1 to 8, wherein an adhesive made of a UV curable resin is coated on an adhesive surface of the tape, and nitrogen is intermittently supplied to the first airtight space when the first and second airtight spaces are brought into a vacuum state.

Supplementary Note 10

A tape attaching method using a tape attaching apparatus, the tape attaching apparatus comprising:
a container having an airtight space formed therein;
an elastic sheet that partitions the airtight space into a first airtight space positioned above and a second airtight space positioned below, a tape attachment target object being placed in the first airtight space;
a tape holding member that holds a tape in the first airtight space and positions the tape at a predetermined distance from the tape attachment target object placed on the elastic sheet; and
atmospheric pressure switching means for switching pressurization and depressurization of the first and second airtight spaces,
the method comprising:
pressurizing the second airtight space and expanding the elastic sheet to lift the tape attachment target object to be attached to the tape, after bringing the first and second airtight spaces into a vacuum state, and
causing the tape attachment target object to be attached to the tape while controlling an amount of pressurization of the second airtight space to change an expansion rate of the elastic sheet from a low speed to a high speed in a stepwise fashion, upon lifting of the tape attachment target object.

Supplementary Note 11

The tape attaching method according to Supplementary note 10, wherein the elastic sheet is expanded at a first speed that allows the tape attachment target object to be pressed against the tape by a pressing force at which no breakage occurs, until a contact area between the tape attachment target object and the tape reaches a predetermined amount, and the expansion rate of the elastic sheet is then switched to a second speed to allow an entire attaching surface of the tape attachment target object to contact the tape, the second speed being higher than the first speed.

Supplementary Note 12

The tape attaching method according to Supplementary note 11, wherein prior to the expansion of the elastic sheet at the first speed, the elastic sheet is expanded at a third speed to allow a center portion of the tape attachment target object to contact the tape, the third speed being lower than the first speed.

Supplementary Note 13

The tape attaching method according to Supplementary note 12, wherein after the first and second airtight spaces are brought into a vacuum state, the second airtight space is closed with the vacuum state of the first airtight space maintained, to thereby expand the elastic sheet at the third speed.

Supplementary Note 14

The tape attaching method according to Supplementary note 11, 12, or 13, wherein upon expansion of the elastic sheet at the second speed, the tape attachment target object and the tape are lifted and pressed against a ceiling surface of the airtight space in a state where the tape attachment target object and the tape contact each other.

Supplementary Note 15

The tape attaching method according to any one of Supplementary notes 10 to 14, wherein an adhesive made of a UV curable resin is coated on an adhesive surface of the tape, and nitrogen is intermittently supplied to the first airtight space when the first and second airtight spaces are brought into a vacuum state.

This application is based upon and claims the benefit of priority from Japanese patent application No. 2010-58629, filed on Mar. 16, 2010, the disclosure of which is incorporated herein in its entirety by reference.

INDUSTRIAL APPLICABILITY

The present invention can be utilized as a tape attaching apparatus and a tape attaching method for use in attaching a dicing tape to a semiconductor wafer, for example.

REFERENCE SIGNS LIST

1 TAPE ATTACHING APPARATUS
2 APPARATUS MAIN BODY
3 SUPPLY/EXHAUST MECHANISM
4 CONTROL UNIT
4a TIMER
5 AIRTIGHT SPACE
6 CHAMBER
6a UPPER CHAMBER
6b LOWER CHAMBER
7 FIRST AIRTIGHT SPACE
7a INSIDE SPACE OF PRESSING RING
7b OUTSIDE SPACE OF PRESSING RING

8 SECOND AIRTIGHT SPACE
9 SEMICONDUCTOR WAFER
10 RUBBER SHEET
11 DICING TAPE
12 TAPE FRAME
13 FIRST SUPPLY/EXHAUST TUBE
14 SECOND SUPPLY/EXHAUST TUBE
14a MESH COVER
15 VACUUM SENSOR
16 SEAL RING
17 SPACER
18 PRESSING RING
19 GROOVE
21 NITROGEN SUPPLY SOURCE
22 AIR SUPPLY SOURCE
23 VACUUM PUMP
24 FIRST SOLENOID VALVE
26 SECOND SOLENOID VALVE
27 THIRD SOLENOID VALVE
28 FLOW CONTROL VALVE

The invention claimed is:

1. A tape attaching method using a tape attaching apparatus, the tape attaching apparatus comprising: a container having an airtight space formed therein; an elastic sheet that partitions the airtight space into a first airtight space positioned above and a second airtight space positioned below, a tape attachment target object being placed in the first airtight space; a tape holding member that holds a tape in the first airtight space and positions the tape at a predetermined distance from the tape attachment target object placed on the elastic sheet; and an atmospheric pressure switching unit that switches pressurization and depressurization of the first and second airtight spaces, the method comprising:
causing the tape attachment target object to be attached to the tape while controlling an amount of pressurization of the second airtight space to change an expansion rate of the elastic sheet from a low speed to a high speed in a stepwise fashion, upon pressurizing the second airtight space and expanding the elastic sheet to lift the tape attachment target object to be attached to the tape, after bringing the first and second airtight spaces into a vacuum state.

2. The tape attaching method according to claim 1, wherein the elastic sheet is expanded at a first speed that allows the tape attachment target object to be pressed against the tape by a pressing force at which no breakage occurs, until a contact area between the tape attachment target object and the tape reaches a predetermined amount, and the expansion rate of the elastic sheet is then switched to a second speed to allow an entire attaching surface of the tape attachment target object to contact the tape, the second speed being higher than the first speed.

3. The tape attaching method according to claim 2, wherein prior to the expansion of the elastic sheet at the first speed, the elastic sheet is expanded at a third speed to allow a center portion of the tape attachment target object to contact the tape, the third speed being lower than the first speed.

4. The tape attaching method according to claim 3, wherein after the first and second airtight spaces are brought into a vacuum state, the second airtight space is closed with the vacuum state of the first airtight space maintained, to thereby expand the elastic sheet at the third speed.

5. The tape attaching method according to claim 2, wherein upon expansion of the elastic sheet at the second speed, the tape attachment target object and the tape are lifted and pressed against a ceiling surface of the airtight space in a state where the tape attachment target object and the tape contact each other.

6. The tape attaching method according to claim 1, wherein the tape includes an adhesive surface coated with an ultraviolet (UV) curable resin,
and
nitrogen is intermittently supplied to the first airtight space when the first and second airtight spaces are brought into a vacuum state.

7. A tape attaching method using a tape attaching apparatus, the tape attaching apparatus comprising:
a container having an airtight space formed therein;
an elastic sheet that partitions the airtight space into a first airtight space positioned above and a second airtight space positioned below, a tape attachment target object being placed in the first airtight space;
a tape holding member that holds a tape in the first airtight space and positions the tape at a predetermined distance from the tape attachment target object placed on the elastic sheet; and
an atmospheric pressure switching unit that switches pressurization and depressurization of the first and second airtight spaces,
the tape attaching method comprising:
causing the tape attachment target object to be attached to the tape by expanding the elastic sheet at a first speed that allows the tape attachment target object to be pressed against the tape by a pressing force at which no breakage occurs, until a contact area between the tape attachment target object and the tape reaches a predetermined amount, upon pressurizing the second airtight space and expanding the elastic sheet to lift the tape attachment target object to be attached to the tape, after bringing the first and second airtight spaces into a vacuum state, and thereafter switching an expansion rate of the elastic sheet to a second speed to allow an entire attaching surface of the tape attachment target object to contact the tape, the second speed being higher than the first speed.

8. The tape attaching method according to claim 7, wherein prior to the expansion of the elastic sheet at the first speed, the elastic sheet is expanded at a third speed to allow a center portion of the tape attachment target object to contact the tape, the third speed being lower than the first speed.

9. The tape attaching method according to claim 8, wherein after the first and second airtight spaces are brought into a vacuum state, the second airtight space is closed with the vacuum state of the first airtight space maintained, to thereby expand the elastic sheet at the third speed.

10. The tape attaching method according to claim 7, wherein upon expansion of the elastic sheet at the second speed, the tape attachment target object and the tape are lifted and pressed against a ceiling surface of the airtight space in a state where the tape attachment target object and the tape contact each other.

11. The tape attaching method according to claim 7, wherein spacers are provided between a lower surface of the elastic sheet and a bottom surface of the airtight space, the spacers being arranged near an intake port for sucking a gas from the second airtight space.

12. The tape attaching method according to claim 11, wherein a plurality of the spacers are provided and arranged in one of a cross shape and a radial shape with the intake port as a center.

13. The tape attaching method according to claim 7, wherein a mesh cover is attached to an intake port for sucking a gas from the second airtight space.

14. The tape attaching method according to claim 7, wherein
an adhesive comprising a UV curable resin is coated on an adhesive surface of the tape, and
nitrogen is intermittently supplied to the first airtight space when the first and second airtight spaces are brought into a vacuum state.

15. The tape attaching method according to claim 9, wherein upon expansion of the elastic sheet at the second speed, the tape attachment target object and the elastic sheet are lifted to be brought into contact with a ceiling surface of the airtight space in a state where the tape attachment target object and the elastic sheet contact each other.

16. The tape attaching method according to claim 10, wherein upon expansion of the elastic sheet at the second speed, the tape attachment target object and the elastic sheet are lifted to be brought into contact with a ceiling surface of the airtight space in a state where the tape attachment target object and the elastic sheet contact each other.

17. A tape attaching method using a tape attaching apparatus, the tape attaching apparatus comprising:
a container having an airtight space formed therein;
an elastic sheet that partitions the airtight space into a first airtight space positioned above and a second airtight space positioned below, a tape attachment target object being placed in the first airtight space;
a tape holding member that holds a tape in the first airtight space and positions the tape at a predetermined distance from the tape attachment target object placed on the elastic sheet; and
atmospheric pressure switching means for switching pressurization and depressurization of the first and second airtight spaces, the second airtight space being pressurized and the elastic sheet being expanded to lift the tape attachment target object to be attached to the tape, after bringing the first and second airtight spaces into a vacuum state, the tape attaching method comprising:
expanding the elastic sheet to allow a center portion of the tape attachment target object to contact the tape by a differential pressure between the first airtight space and the second airtight space which are generated due to spontaneous leakage in the second airtight space when the first and second airtight spaces are brought into a vacuum state.

18. The tape attaching method according to claim 17, wherein after the center portion of the tape attachment target object is brought into contact with the tape, the second airtight space is pressurized while controlling an amount of pressurization by the pressure switching means to expand the elastic sheet at a speed that allows the tape attachment target object to be pressed against the tape by a pressing force at which no breakage occurs, until a contact area between the tape attachment target object and the tape reaches a predetermined amount.

* * * * *